(12) United States Patent
Saito et al.

(10) Patent No.: US 6,949,819 B2
(45) Date of Patent: Sep. 27, 2005

(54) JUMPER CHIP COMPONENT AND MOUNTING STRUCTURE THEREFOR

(75) Inventors: Shuji Saito, Miyagi-ken (JP); Satoru Matsuzaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/322,134

(22) Filed: Dec. 17, 2002

(65) Prior Publication Data

US 2003/0123237 A1 Jul. 3, 2003

(30) Foreign Application Priority Data

Dec. 27, 2001 (JP) ........................................ 2001-398515

(51) Int. Cl.⁷ .............................................. H01L 23/48
(52) U.S. Cl. ........................ 257/692; 257/730; 361/777
(58) Field of Search ................................. 257/691–697, 257/728, 777, 730; 333/728; 361/777

(56) References Cited

U.S. PATENT DOCUMENTS

| | | | |
|---|---|---|---|
| 4,288,840 A | | 9/1981 | Konishikawa et al. |
| 5,532,658 A | * | 7/1996 | Tonegawa et al. ............ 333/246 |
| 5,907,265 A | * | 5/1999 | Sakuragawa et al. .......... 333/1 |
| 6,751,101 B2 | * | 6/2004 | Sakai ............................ 361/736 |

FOREIGN PATENT DOCUMENTS

| | | |
|---|---|---|
| EP | 1 047 291 | 4/2000 |
| JP | 03071572 | 3/1991 |
| JP | 03110768 | 5/1991 |
| JP | H05-050672 | 7/1993 |
| JP | 07335995 | 12/1995 |

* cited by examiner

Primary Examiner—Leonardo Andújar
(74) Attorney, Agent, or Firm—Brinks Hofer Gilson & Lione

(57) ABSTRACT

A jumper chip component of the present invention includes a connection conductor formed of a conductive layer over an upper face and opposite side faces of an insulating substrate, and a conductive material formed of a conductive layer between plates of the insulating substrate and on a side face at the corner of the insulating substrate so as not to be electrically connected to the connection conductor. Since the conductive material formed between the plates of the insulating substrate opposes the connection conductor formed on the upper face of the insulating substrate, the connection conductor formed on the upper face of the insulating substrate and a second conductive pattern disposed under the insulating substrate are shielded from each other by the conductive material, and good isolation is possible.

10 Claims, 8 Drawing Sheets

JUMPER CHIP COMPONENT AND MOUNTING STRUCTURE THEREFOR

This application claims the benefit of priority to Japanese Patent Application 2001-398515, filed on Dec. 27, 2001.

BACKGROUND OF THE INVENTION

1. Field of the Invention

The present invention relates to a jumper chip component suitable for use in a high-frequency device, such as a satellite receiving converter, and to a mounting structure therefor.

2. Description of the Related Art

A conventional jumper structure will be described with reference to FIG. 12. A circuit board 51 on which various electrical components (not shown) are mounted is provided with a pair of first conductive patterns 52a and 52b spaced from each other, and a second conductive pattern 53 extending between the pair of first conductive patterns 52a and 52b.

A jumper wire 54 made of a conductive wire is soldered to the first conductive patterns 52a and 52b at both ends while crossing over the second conductive pattern 53.

Since the conventional jumper structure adopts the jumper wire 54, automation of mounting operation is difficult, and productivity is low.

When the jumper wire 54 is mounted on the circuit board 51, the jumper wire 54 and the second conductive pattern 53 crossing each other oppose and interfere with each other, which worsens isolation.

SUMMARY OF THE INVENTION

Accordingly, an object of the present invention is to provide a jumper chip component that can automate and improve mounting operation and that achieves good isolation, and a mounting structure therefor.

In order to overcome the above problems, according to a first aspect, the present invention provides a jumper chip component including an insulating substrate composed of a stacked rectangular plates, a connection conductor formed of a conductive layer over an upper face and opposite side faces of the insulating substrate, and a conductive material formed of a conductive layer between the plates of the insulating substrate and on a side face at a corner of the insulating substrate so as not to be electrically connected to the connection conductor, wherein the conductive material formed between the plates of the insulating substrate opposes the connection conductor formed on the upper face of the insulating substrate.

In this case, the connection conductor on the upper face of the insulating substrate and the second conductive pattern placed under the insulating substrate are shielded from each other by the conductive material. Consequently, interference therebetween is minimized, and good isolation is possible.

Since the jumper member is made of a chip component, mounting thereof can be automated, and mounting operation can be improved.

Since the conductive material is formed on the side face at the corner of the insulating substrate, it can be firmly mounted, and can be soldered to the third conductive pattern for grounding at a distance from the second conductive pattern. This allows flexibility in the soldering position of the jumper chip component.

Preferably, the conductive material formed on the side face of the insulating substrate is formed at a plurality of corners. This allows firm mounting of the jumper chip component and reliable grounding.

Preferably, the conductive material is formed at each of the four corners. This allows firmer mounting of the jumper chip component and more reliable grounding.

Preferably, the conductive material is formed on the adjoining side faces. This allows firmer mounting of the jumper chip component and more reliable grounding.

Preferably, a cutoff portion is formed at the corner of the insulating substrate, and the conductive material is formed on the side face having the cutoff portion. This allows the conductive material to be easily formed on the side face of the insulating substrate.

Preferably, the connection conductor and the conductive material extend from the side faces and said side face, respectively, onto the lower face of the insulating substrate. In this case, the connection conductor and the conductive material can be soldered well to the conductive patterns.

Preferably, at least three connection conductors are arranged side by side. In this case, the center connection conductor is connected to the conductive pattern for grounding, and interference between the hot-side connection conductors on both sides can be reduced by the center connection conductor for grounding.

According to another aspect, the present invention provides a jumper chip component including a rectangular insulating substrate, a connection conductor formed of a conductive layer over an upper face and opposite side faces of the insulating substrate, a conductive material formed of a conductive layer on a lower face of the insulating substrate and on a side face at a corner of the insulating substrate so as not to be electrically connected to the connection conductor, and an insulating film formed on the lower face of the insulating substrate so as to cover the surface of the conductive material, wherein the conductive material formed on the lower face of the insulating substrate opposes the connection conductor formed on the upper face of the insulating substrate.

In this case, the connection conductor on the upper face of the insulating substrate and the second conductive pattern disposed under the insulating substrate are shielded from each other by the conductive material. Consequently, interference therebetween is minimized, and good isolation is possible.

Since the insulating film is provided, thickness reduction is possible. Moreover, since the jumper member is made of a chip component, mounting thereof can be automated, and mounting operation is improved.

Since the conductive material is formed on the side face at the corner of the insulating substrate, it can be firmly mounted. Moreover, the conductive material can be soldered to the third conductive pattern for grounding at a distance from the second conductive pattern, and this allows flexibility in the soldering position of the jumper chip component.

Preferably, the conductive material formed on the side face of the insulating substrate is formed at a plurality of corners. This allows firm mounting of the jumper chip component and reliable grounding.

Preferably, the conductive material is formed at each of the four corners. This allows firmer mounting of the jumper chip component and more reliable grounding.

Preferably, the conductive material is formed on the adjoining side faces. This allows firmer mounting of the jumper chip component and more reliable grounding.

Preferably, a cutoff portion is formed at the corner of the insulating substrate, and the conductive material is formed on the side face having the cutoff portion. This allows the conductive material to be easily formed on the side face of the insulating substrate.

Preferably, the connection conductor and the conductive material extend from the side faces and the side face, respectively, onto the lower face of the insulating substrate. In this case, the connection conductor and the conductive material can be soldered well to the conductive patterns.

Preferably, at least three connection conductors are arranged side by side. In this case, the center connection conductor is connected to the conductive pattern for grounding, and interference between the hot-side connection conductors on both sides can be reduced by the center connection conductor for grounding.

According to a further aspect, the present invention provides a mounting structure for a jumper chip component, including the above jumper chip component, and a circuit board having a conductive pattern, wherein the conductive pattern includes a pair of first conductive patterns spaced from each other, a second conductive pattern extending between the first conductive patterns, and a third conductive pattern for grounding, and wherein the jumper chip component is placed on the circuit board so that the lower face of the insulating substrate of the jumper chip component is positioned on the second conductive pattern, both ends of the connection conductor crossing the second conductive pattern are soldered to the pair of first conductive patterns, respectively, and the conductive material is soldered to the third conductive pattern.

In this case, the second conductive pattern disposed under the insulating substrate and the connection conductor crossing the second conductive pattern are shielded from each other by the conductive material that is grounded by the third conductive pattern. Consequently, interference therebetween is minimized, good isolation is possible, and the mounting structure is suitable for use in a high-frequency device.

Preferably, a plurality of third conductive patterns are provided, and the conductive material formed at the corner of the insulating substrate is soldered to the corresponding third conductive patterns. This allows reliable grounding of the conductive materials in the mounting structure.

According to a further aspect, the present invention provides a mounting structure for a jumper chip component, including the above jumper chip component, and a circuit board on which at least three pairs first conductive patterns are arranged side by side, wherein three connection conductors are soldered to the corresponding three pairs of first conductive patterns, and the center pair of conductive patterns of the three pairs of first conductive patterns are used for grounding.

In this case, the center connection conductor is connected to the conductive pattern for grounding, and interference between the hot-side connection conductors on both sides is reduced by the center connection conductor for grounding.

According to a further aspect, the present invention provides a mounting structure for a jumper chip component, including the above jumper chip component, and a circuit board having a conductive pattern, wherein the conductive pattern includes a pair of first conductive patterns spaced from each other, a second conductive pattern extending between the first patterns, and a third conductive pattern for grounding, and wherein the jumper chip component is placed on the circuit board in a state in which the insulating film of the jumper chip component is positioned on the second conductive pattern, both ends of the connection conductor crossing the second conductive pattern are soldered to the pair of first conductive patterns, and the conductive material is soldered to the third conductive pattern.

In this case, the second conductive pattern disposed under the insulating substrate and the connection conductor crossing the second conductive pattern are shielded from each other by the conductive material grounded by the third conductive pattern. Consequently, interference therebetween is minimized, good isolation is achieved, and therefore, the mounting structure is suitable for use in a high-frequency device.

Preferably, a plurality of third conductive patterns are provided, and the conductive materials formed at the corners of the insulating substrate are soldered to the corresponding third conductive patterns. This allows the conductive materials to be reliably grounded.

According to a further aspect, the present invention provides a mounting structure for a jumper chip component, including the above jumper chip component, and a circuit board on which at least three pairs of first conductive patterns are arranged side by side, wherein the three connection conductors are soldered to the corresponding three pairs of first conductive patterns, and the center pair of first conductive patterns of the three pairs of first conductive patterns are used for grounding.

In this case, the center connection conductor is connected to the conductive pattern for grounding, and interference between the hot-side connection conductors on both sides is minimized by the center connection conductor for grounding.

Further objects, features, and advantages of the present invention will become apparent from the following description of the preferred embodiments with reference to the attached drawings.

DESCRIPTION OF THE PREFERRED EMBODIMENTS

Figure 1:
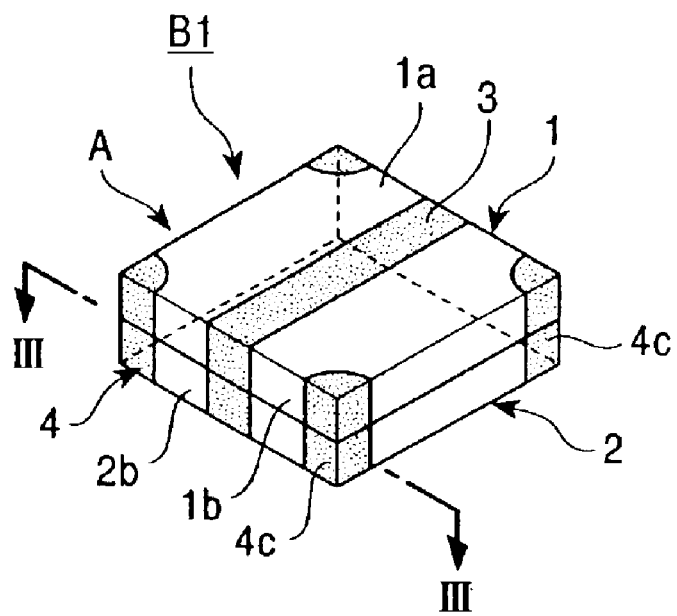
FIG. 1 is a perspective view of a jumper chip component according to a first embodiment of the present invention.

The configuration of a jumper chip component according to a first embodiment of the present invention will now be described with reference to FIGS. 1 to 3. An insulating substrate A made of ceramic or the like is composed of a plurality of stacked rectangular plates 1 and 2.

A connection conductor 3 made of a conductive layer of silver or the like is formed over an upper face 1a and opposite side faces 1b and 2b of the insulating substrate A and a lower face 2c of the rectangular plate 2. Connecting portions 3a are formed in portions of the side faces 1b and 2b and the lower face 2c in which the connection conductor 3 is formed.

A conductive material 4 made of a conductive layer of silver or the like includes a shielding portion 4a formed between the rectangular plates 1 and 2 of the insulating substrate A, cutout portions 4b formed so as not to be electrically connected to the connecting portions 3a of the connection conductor 3, and a plurality of connecting portions 4c formed on the side faces 1b and 2b at four corners of the insulating substrate A.

The shielding portion 4a opposes the connection conductor 3 on the upper face 1a with the upper rectangular plate 1 therebetween, and the connecting portions 4c are formed on the side faces 1b and 2b adjoining with the corners therebetween.

The connecting portions 4c of the conductive material 4 extend over the upper face 1a and the lower face 2c of the insulating substrate A.

A jumper chip component B1 of the first embodiment has the above configuration.

The configuration of a jumper chip component according to a second embodiment of the present invention will now be described with reference to FIG. 4. In the second embodiment, arc-shaped cutoff portions 1d are formed on opposite side faces 1b and 2b of an insulating substrate A, and arc-shaped cutoff portions 1e are formed at four corners of the insulating substrate A.

Connecting portions 3a of a connection conductor 3 are formed in the cutoff portions 1d, and connecting portions 4c of a conductive material 4 are formed in the cutoff portions 1e at the four corners.

Since other structures are similar to those in the above-described first embodiment, the same components are denoted by the same numerals, and descriptions thereof are omitted.

A jumper chip component B1 of the second embodiment has the above configuration. The connecting portions 3a and 4c are formed in recesses serving as the cutoff portions 1d and 1e that are formed in the large substrate, and the large substrate is then cut with reference to the recesses, so that a desired jumper chip component can be obtained. Consequently, the connecting portions 3a and 4c can be formed easily.

The configuration of a jumper chip component according to a third embodiment of the present invention will now be described with reference to FIG. 5. In the third embodiment, a plurality of (three in this embodiment) connection conductors 3 are arranged side by side.

Since other structures are similar to those in the above-described first embodiment, the same components are denoted by the same reference numerals, and descriptions thereof are omitted.

A jumper chip component B1 of the third embodiment has the above configuration.

Of the plurality of connection conductors 3, two connection conductors 3 on both sides are connected to hot-side conductive patterns, and the center connection conductor 3 is connected to a conductive pattern for grounding, as will be described later. Interference between the hot-side connection conductors 3 on both sides is reduced by the center connection conductor 3 for grounding.

Figure 2:
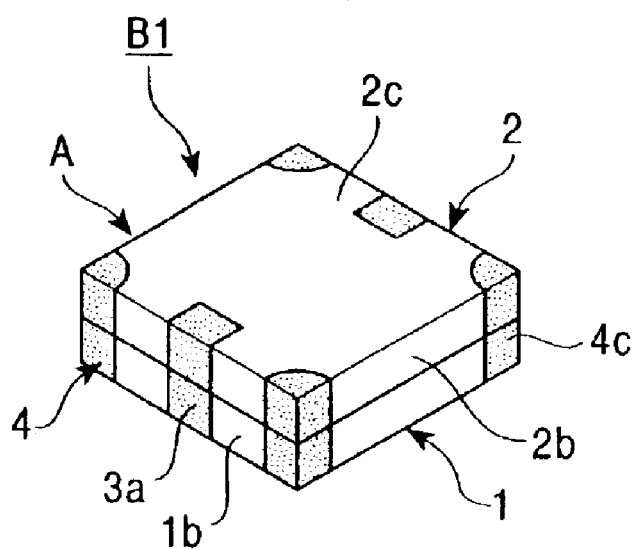
FIG. 2 is a rear perspective view of the jumper chip component.
Figure 3:
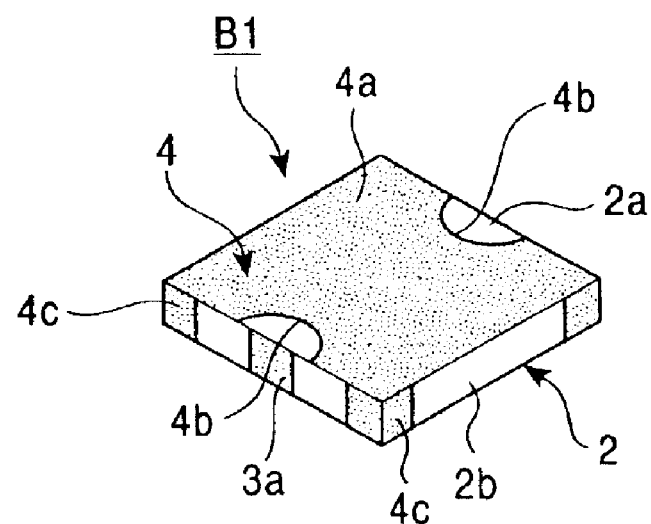
FIG. 3 is a perspective view of the jumper chip component, as viewed from line III—III in FIG. 1.

In the third embodiment, cutoff portions 1d and 1e may be formed, as in the second embodiment shown in FIG. 2.

Figure 6:
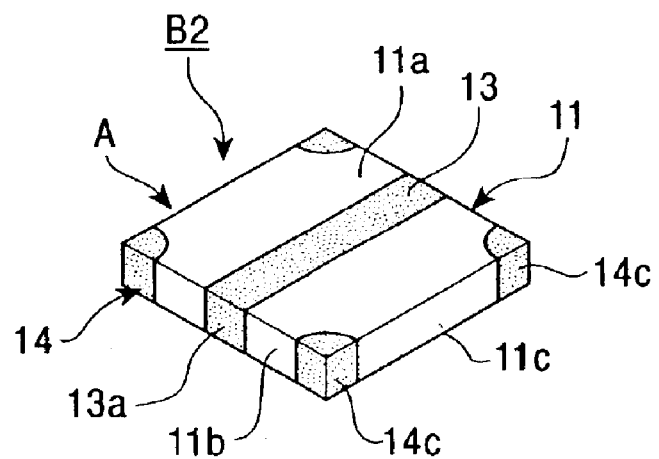
FIG. 6 is a perspective view of a jumper chip component according to a fourth embodiment of the present invention.
Figure 7:
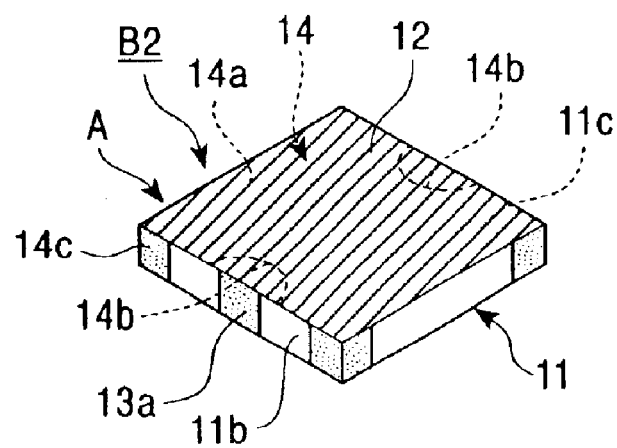
FIG. 7 is a rear perspective view of the jumper chip component.

The configuration of a jumper chip component according to a fourth embodiment of the present invention will now be described with reference to FIGS. 6 and 7. In the fourth embodiment, an insulating substrate A is formed of a single-layer or multilayer rectangular plate 11 of ceramic or the like.

A connection conductor 13 made of a conductive layer of silver or the like is formed over an upper face 11a and opposite side faces 11b of the rectangular plate 11. Connecting portions 13a are formed in portions of the side faces 11b in which the connection conductor 13 is formed.

A conductive material 14 made of a conductive layer of silver or the like includes a shielding portion 14a formed on a lower face 11c of the rectangular plate 11, cutout portions 14b formed so as not to be electrically connected to the connecting portions 13a of the connection conductor 13, and a plurality of connecting portions 14c formed on the side faces 11b of the rectangular plate 11.

The shielding portion 14a opposes the connection conductor 13 with the rectangular plate 11 therebetween, and the connecting portions 14c are formed on the side faces 11b adjoining with the corners of the rectangular plate 11.

An insulating film 12 made of an insulating material is formed on the conductive material 14 on the lower face 11c of the rectangular plate 11.

Such structures constitute a jumper chip component B2 of the second embodiment.

Figure 4:
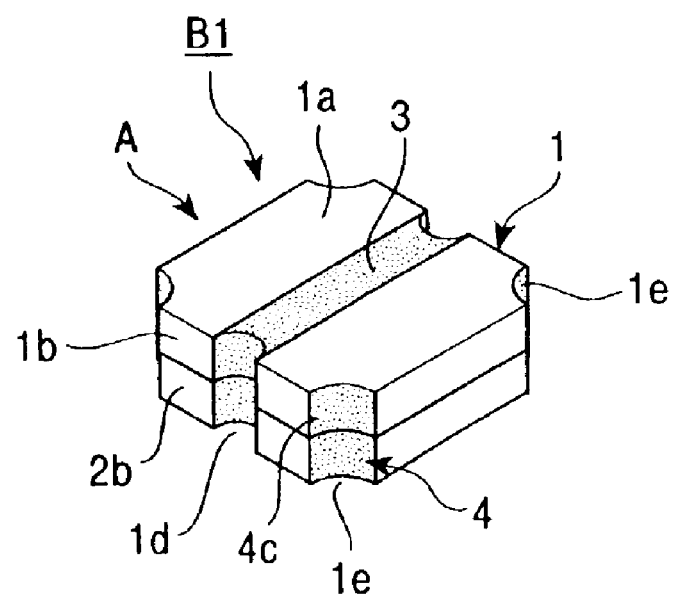
FIG. 4 is a perspective view of a jumper chip component according to a second embodiment of the present invention.
Figure 5:
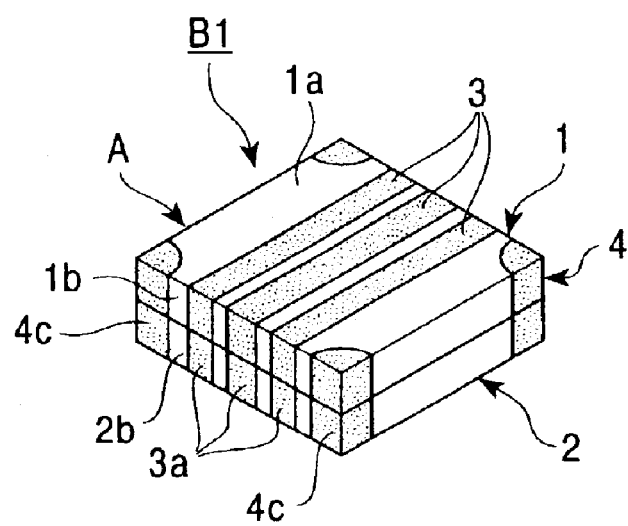
FIG. 5 is a perspective view of a jumper chip component according to a third embodiment of the present invention.

In the fourth embodiment, cutoff portions 1d and 1e may also be formed, as in the second embodiment shown in FIG. 4, and three connection conductors 3 may be provided, as in the third embodiment shown in FIG. 5.

The connection conductor 13 and the conductive material 14 may extend from the side faces of the rectangular plate 11 onto the lower face thereof.

Figure 8:
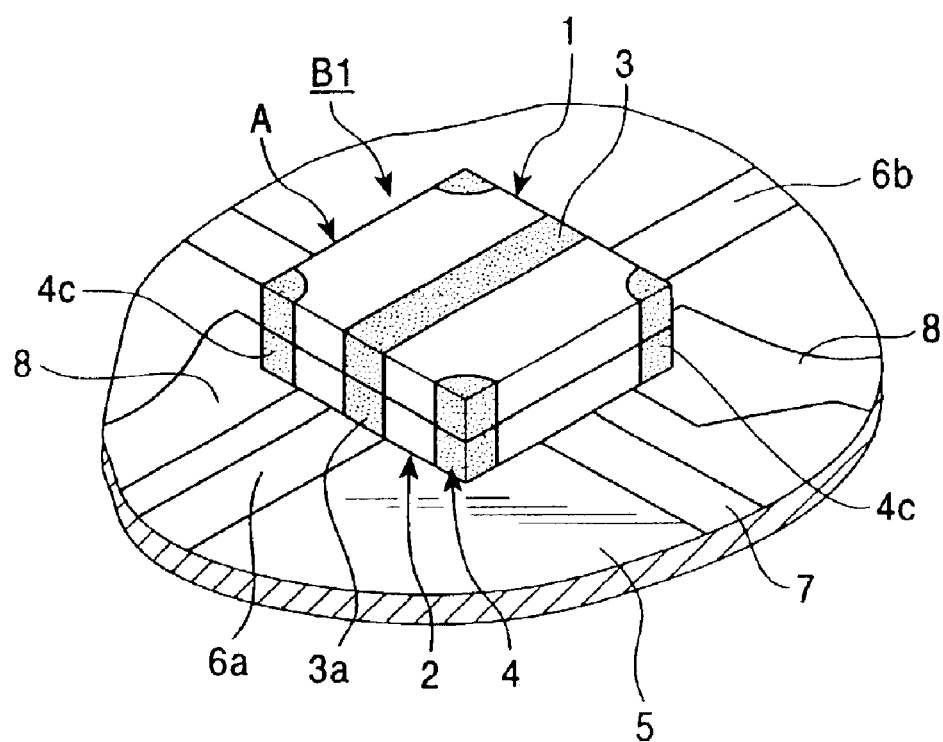
FIG. 8 is a perspective view showing a mounting structure for a jumper chip component according to a fifth embodiment of the present invention.
Figure 9:
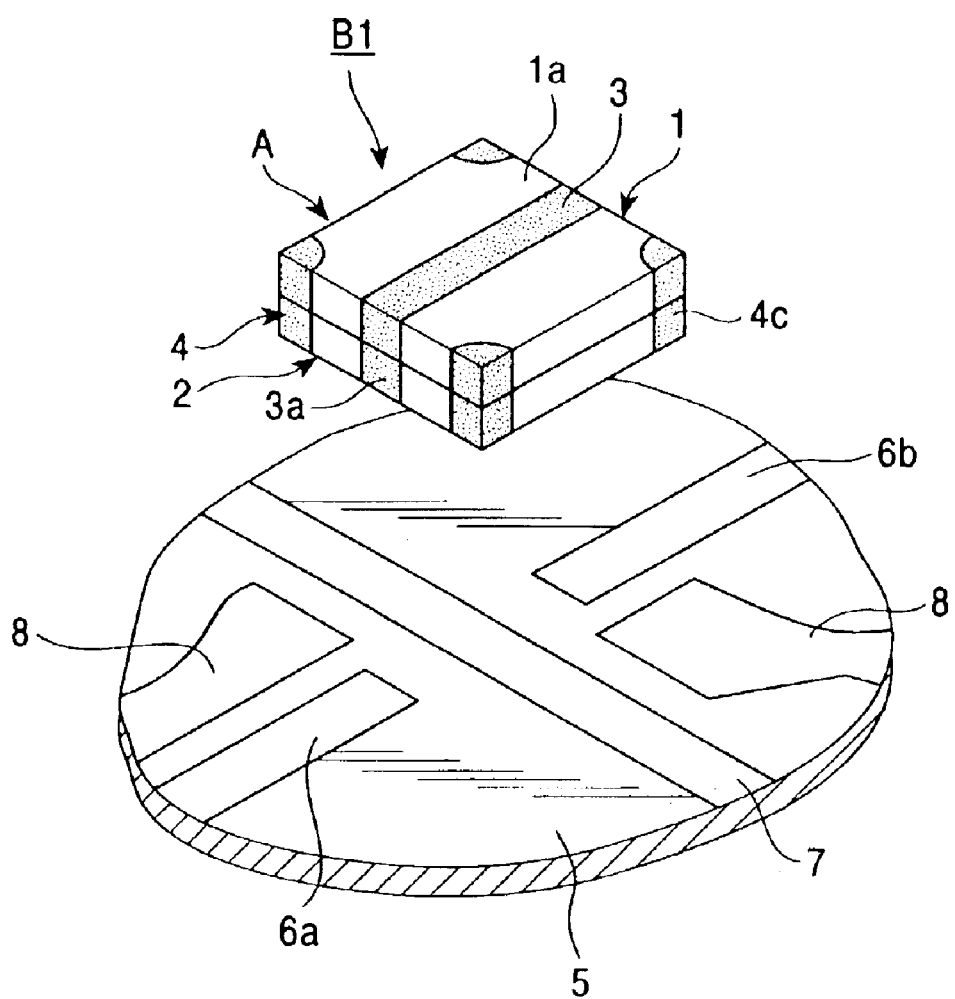
FIG. 9 is an exploded perspective view showing the mounting structure for a jumper chip component.

The configuration of a mounting structure for a jumper chip component according to a fifth embodiment of the present invention will now be described with reference to FIGS. 8 and 9. A circuit board 5 on which various electrical components (not shown) are mounted is provided with a pair of first conductive patterns 6a and 6b spaced from each other, a second conductive pattern 7 extending between the first conductive patterns 6a and 6b, and a plurality of third conductive patterns 8 for grounding.

The jumper chip component B1 of the above-described first embodiment is placed on the circuit board 5 so that it is positioned on the second conductive pattern 7.

In this case, the shielding portion 4a of the conductive material 4 is insulated from the second conductive pattern 7 by the lower rectangular plate 2. The connecting portions 3a of the connection conductor 3 are positioned on the first conductive patterns 6a and 6b, and the connecting portions 4c of the conductive material 4 are positioned on the third conductive patterns 8.

In the jumper chip component B1 placed on the circuit board 5 in such a state, the connection conductor 3 is soldered to the first conductive patterns 6a and 6b and the conductive material 4 is soldered to the third conductive patterns 8 with solder cream (not shown) applied on the circuit board 5.

When the jumper chip component B1 is mounted on the circuit board 5, the second conductive pattern 7 and the connection conductor 3 cross each other, and the shielding portion 4a of the conductive material 4 is interposed therebetween.

The above-described mounting structure for a jumper chip component is used in, for example, a frequency conversion section, including four mixers and local oscillators thereof, for subjecting horizontally and vertically polarized signals of radio waves sent from two satellites to frequency conversion.

While a high-frequency signal passes through the second conductive pattern 7 and the connection conductor 3, interference therebetween is minimized because the shielding portion 4a of the conductive material 4 is interposed therebetween.

Figure 10:
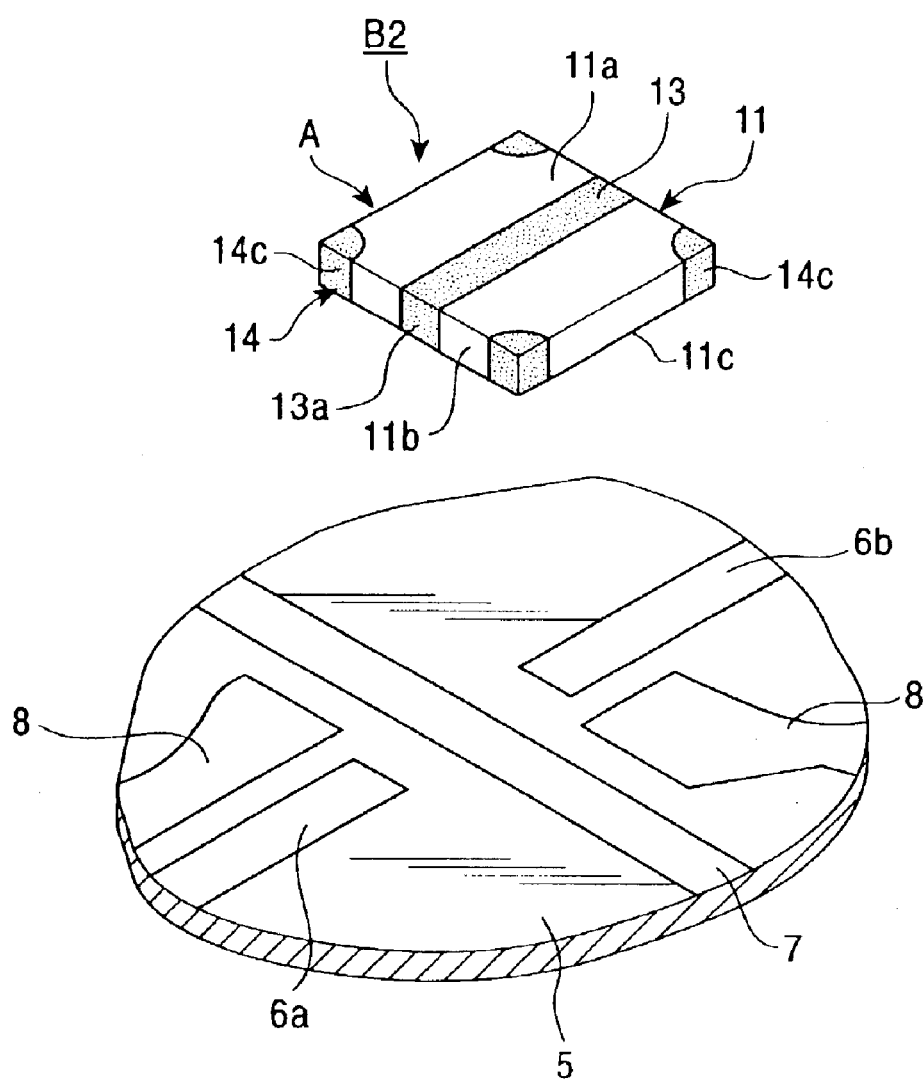
FIG. 10 is an exploded perspective view showing a mounting structure for a jumper chip component according to a sixth embodiment of the present invention.

The configuration of a mounting structure for a jumper chip component according to a sixth embodiment of the present invention will now be described with reference to FIG. 10. A circuit board 5 on which various electrical components (not shown) are mounted is provided with a pair of first conductive patterns 6a and 6b spaced from each other, a second conductive pattern 7 extending between the first conductive patterns 6a and 6b, and a plurality of third conductive patterns 8 for grounding, in a manner similar to that in the fifth embodiment shown in FIGS. 8 and 9.

The jumper chip component B2 of the above-described fourth embodiment is placed on the circuit board 5 so that it is positioned on the second conductive pattern 7.

In this case, the shielding portion 14a of the conductive material 14 is insulated from the second conductive pattern 7 by the insulating film 12. The connecting portions 13a of the connection conductor 13 are positioned on the first conductive patterns 6a and 6b, and the connecting portions 14c of the conductive material 14 are positioned on the third conductive patterns 8.

In the jumper chip component B2 placed on the circuit board 5 in such a state, the connection conductor 13 is soldered to the first conductive patterns 6a and 6b and the conductive material 14 is soldered to the third conductive patterns 8 with solder cream (not shown) applied on the circuit board 5.

When the jumper chip component B2 is mounted on the circuit board 5, the second conductive pattern 7 and the connection conductor 13 cross each other, and the shielding portion 14a of the conductive material 14 is interposed therebetween.

The above-described mounting structure for a jumper chip component is used in, for example, a frequency conversion section, including four mixers and local oscillators thereof, for subjecting horizontally and vertically polarized signals of radio waves sent from two satellites to frequency conversion.

While a high-frequency signal passes through the second conductive pattern 7 and the connection conductor 13, interference therebetween is minimized because the shielding portion 14a of the conductive material 14 is interposed therebetween.

Figure 11:
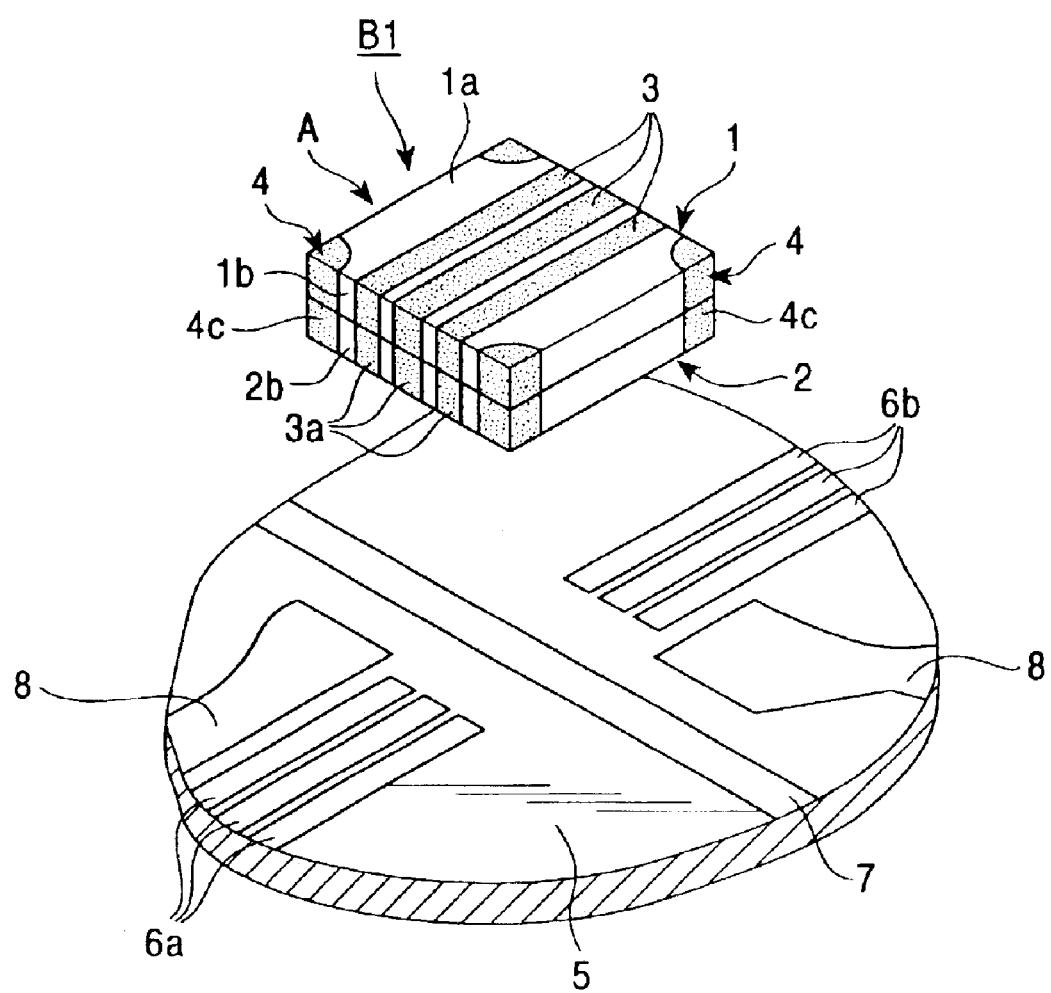
FIG. 11 is an exploded perspective view showing a mounting structure for a jumper chip component according to a seventh embodiment of the present invention.
Figure 12:
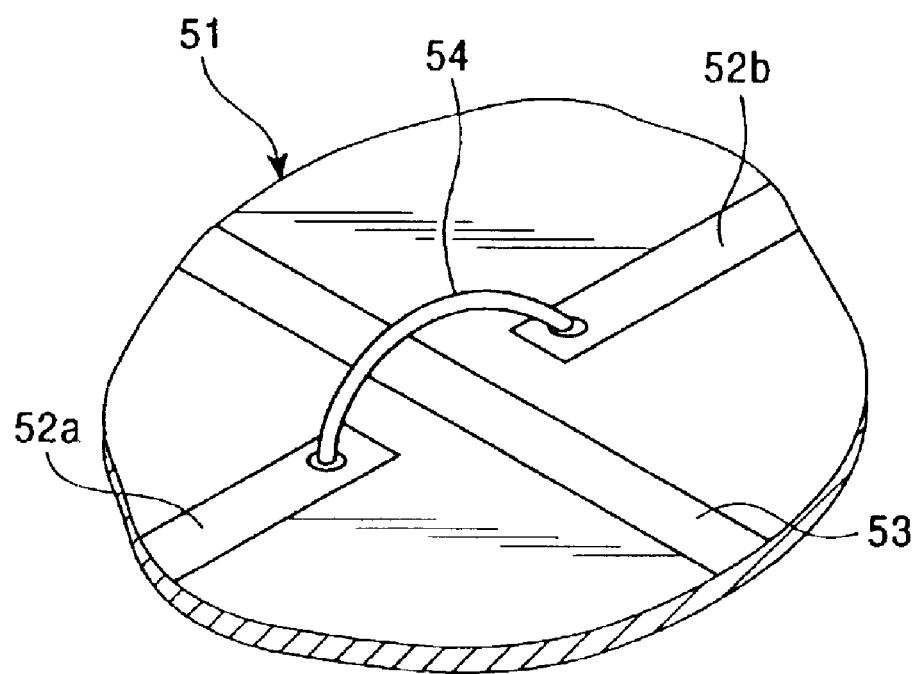
FIG. 12 is a perspective view showing the principal part of a conventional jumper structure.

The configuration of a mounting structure for a jumper chip component according to a seventh embodiment of the present invention will now be described with reference to FIG. 11. A circuit board 5 on which various electrical components (not shown) are mounted is provided with three pairs of first conductive patterns 6a and 6b spaced from each other, a second conductive pattern 7 extending between the first conductive patterns 6a and 6b, and a plurality of third conductive patterns 8 for grounding.

The jumper chip component B1 of the above-described third embodiment is placed on the circuit board 5 so that it is positioned on the second conductive pattern 7.

In this case, the shielding portion 4a of the conductive material 4 is insulated from the second conductive pattern 7 by the lower rectangular plate 2. The connecting portions 3a of the three connection conductors 3 are positioned on the corresponding three pairs of first conductive patterns 6a and 6b, and the connecting portions 4c of the conductive material 4 are positioned on the third conductive patterns 8.

In the jumper chip component B1 placed on the circuit board 5 in such a state, the connection conductors 3 are soldered to the three pairs of first conductive patterns 6a and 6b and the conductive material 4 is soldered to the third conductive patterns 8 with solder cream (not shown) applied on the circuit board 5.

When the jumper chip component B1 is mounted on the circuit board 5, the second conductive pattern 7 and the connection conductors 3 cross each other, and the shielding portion 4a of the conductive material 4 is interposed therebetween.

The center first conductive patterns 6a and 6b of the three pairs of first conductive patterns 6a and 6b arranged side by side are used for grounding. Therefore, the center connection conductor 3 of the three connection conductors 3 is grounded.

For this reason, interference between the hot-side connection conductors 3 on both sides is reduced by the center grounded connection conductor 3.

The above-described mounting structure for a jumper chip component is used in, for example, a frequency conversion section, including four mixers and local oscillators thereof, for subjecting horizontally and vertically polarized signals of radio waves sent from two satellites to frequency conversion.

While a high-frequency signal passes through the second conductive pattern 7 and the connection conductor 3, interference therebetween is minimized because the shielding portion 4a of the conductive material 4 is interposed therebetween.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A jumper chip component comprising:
   an insulating substrate composed of a stacked rectangular plates;
   a connection conductor formed of a conductive layer over an upper face and opposite side faces of said insulating substrate; and
   a conductive material formed of a conductive layer between said plates of said insulating substrate and on a side face at a corner of said insulating substrate so as not to be electrically connected to said connection conductor, wherein said conductive material formed between said plates of said insulating substrate opposes said connection conductor formed on said upper face of said insulating substrate.

2. A jumper chip component according to claim 1, wherein said conductive material formed on said side face of said insulating substrate is formed at a plurality of said corners.

3. A jumper chip component according to claim 2, wherein said conductive materal is formed at each of four corners of the insulating substrate.

4. A jumper chip component according to claim 1, wherein said conductive material is formed on adjoining side faces of the insulating substrate.

5. A jumper chip component according to claim 1, wherein a cutoff portion is formed at said come of said insulating substrate, and said conductive material is formed on said side face having said cutoff portion.

6. A jumper chip component according to claim 1, wherein said connection conductor and said conductive material extend from said side faces onto a lower face of said insulating substrate.

7. A jumper chip component according to claim 1, wherein at least three connection conductors are arranged side by side.

8. A mounting structure for a jumper chip component, comprising:
   said jumper chip component according to claim 1; and
   a circuit board having a conductive pattern,
   wherein said conductive pattern includes a pair of first conductive patterns spaced from each other, a second conductive pattern extending between said first conductive patterns, and a third conductive pattern for grounding, and
   wherein said jumper chip component is placed on said circuit board so that a lower face of said insulating substrate of said jumper chip component is positioned on said second conductive pattern, both ends of said connection conductor crossing said second conductive pattern are soldered to said pair of first conductive patterns, respectively, and said conductive material is soldered to said third conductive pattern.

9. A mounting structure for a jumper chip component according to claim 8, wherein a plurality of said third conductive patterns are provided, and said conductive material formed at said corner of said insulating substrate is soldered to said third conductive patterns.

10. A mounting structure for a jumper chip component according to claim 8, comprising:
    said jumper chip component wherein at least three connection conductors are arranged side by side; and
    said circuit board on which at least three pairs of first conductive patterns are arranged side by side,
    wherein said three connection conductors are soldered to said corresponding three pairs of first conductive patterns, and a center pair of conductive patterns of said three pairs of first conductive patterns are used for grounding.

* * * * *